United States Patent [19]

Hsue et al.

[11] Patent Number: 5,750,438
[45] Date of Patent: May 12, 1998

[54] METHOD FOR FABRICATING A LOCAL INTERCONNECTION STRUCTURE

[75] Inventors: Chen-Chiu Hsue; Sun-Chieh Chien, both of Hsinchu, Taiwan

[73] Assignee: United Microelectronics Corporation, Hsinchu, Taiwan

[21] Appl. No.: 658,032

[22] Filed: Jun. 4, 1996

[51] Int. Cl.⁶ .................. H01L 21/283; H01L 21/306
[52] U.S. Cl. .................. 438/627; 438/634; 438/643; 438/648; 438/649; 438/720; 438/724
[58] Field of Search .................. 437/41 SM, 190, 437/192, 200, 195; 438/627, 634, 643, 648, 653, 656, 720, 734, 742, 743, 744, 723, 724

[56] References Cited

U.S. PATENT DOCUMENTS

| | | | |
|---|---|---|---|
| 4,657,628 | 4/1987 | Holloway et al. | 156/643 |
| 4,793,896 | 12/1988 | Douglas | 438/720 |
| 4,994,402 | 2/1991 | Chiu | 437/41 |
| 5,216,281 | 6/1993 | Butler | 257/750 |
| 5,420,071 | 5/1995 | Burke | 438/720 |
| 5,508,212 | 4/1996 | Wang et al. | 437/24 |
| 5,510,292 | 4/1996 | Hayashi | 438/720 |

*Primary Examiner*—T. N. Quach
*Attorney, Agent, or Firm*—Townsend and Townsend and Crew LLP

[57] ABSTRACT

A local interconnection structure is disclosed. The local interconnection structure is formed on a silicon substrate in which a polysilicon gate and a number of diffusion regions exist. The structure includes a number of metal silicide layers over the substrate, a metal nitride layer over the silicide layers, and a dielectric layer over the nitride layer. The metal nitride layer which electrically connects the diffusion regions and the gate forms the interconnection. The method for fabricating the interconnection structure includes the steps of preparing the silicon substrate, sputtering a metal layer, annealing to form silicide and the nitride layers, depositing the dielectric layer, and patterning the nitride layer and the metal nitride by covering with a mask, etching away portions of both the dielectric layer and metal nitride layer not covered by the mask, and removing the mask after etching.

9 Claims, 4 Drawing Sheets

METHOD FOR FABRICATING A LOCAL INTERCONNECTION STRUCTURE

BACKGROUND OF THE INVENTION

1. Field of the invention

The present invention relates to fabrication of semiconductor integrated circuits and, more specifically, to a local interconnection structure and a method to fabricate it on a silicon substrate.

2. Description of the prior art

In order to electrically connect various elements in a semiconductor integrated circuit, buried contact structures as well as local interconnection structures in which metal or metal silicide materials are utilized can be provided for reducing the effective resistance and thus improving the conductivity. The local interconnection structure electrically connects different conducting regions in a semiconductor integrated circuit through a conducting line or layer. Therefore, several additional process steps are required to build a secure and lossless interconnection structure.

A conventional local interconnection structure and its fabrication method are described with reference to the cross-sectional views of FIG. 1 through FIG. 3.

First referring to FIG. 1, an oxidation step is carried out on a silicon substrate 10 to form field oxide layers 12a and 12b. Then a thin oxide layer and a conducting polysilicon layer are successively formed over the substrate and are patterned as a polysilicon gate 14. In order to form source/drain regions, two diffusion regions 13a, 13b and 15 are formed at opposite sides of polysilicon gate 14 in silicon substrate 10 by an ion implantation step. A titanium layer 16 is sputtered over diffusion regions 13a, 13b and 15, polysilicon gate 14 and field oxide 12a and 12b. Furthermore, an amorphous silicon layer 17 is deposited over titanium layer 16. The desired local interconnection region is then defined and covered by a mask layer 11, as shown in FIG. 1.

Next referring to FIG. 2, the exposed regions of amorphous silicon layer 17 are removed by selectively etching. A remaining amorphous silicon 18 cross-over field oxide layer 12b can be obtained after the etching step and removal of mask layer 11.

The structure of FIG. 2 is then subjected to an annealing step to form a titanium silicide layer by reaction between amorphous layer 18 and titanium layer 16. Titanium layer 16 also reacts with silicon materials in diffusion regions 13a, 13b and 15 and gate 14. However, the titanium materials over field oxide layer 12a and other non-silicon materials (such as dielectric spacers at sidewalls of the gate) do not react into silicide, that is, they remain metal. After the removal of the remaining titanium metal, and referring to FIG. 3, a local interconnection structure in which a titanium silicide layer 19b electrically connects polysilicon gate 14, diffusion region 13a, and diffusion region 15 is formed. There is another silicide layer 19a over diffusion region 13b.

In the aforementioned processes, especially in the annealing step, additional tasks are required to improve the quality of the local interconnection structure. For example, the necessary annealing temperature to form titanium silicide layer is about 600° C. in nitrogen containing ambient. In such a situation, the titanium material will react with nitrogen to become titanium nitride. The titanium nitride has to be removed, or the quality of the local interconnection structure is adversely affected. Therefore, an additional selective etching step to remove the titanium nitride is required. Furthermore, the titanium silicide layer formed by annealing at 600° C. is not the most stable silicide, that is, its effective conductivity is not the lowest. Another higher temperature annealing step must be carried out to cause a phase transition in the silicide layer to attain the most stable state. The additional annealing step is carried out in a temperature range from 700° to 750° C. and in a nitrogen-containing ambient.

Another problem associated with the conventional processes is the deposition of amorphous silicon layer 17. Since particles which often cause leakage current in a semiconductor integrated circuit will be produced during the deposition of the amorphous silicon, the performance of the local interconnection structure is adversely affected. Moreover, the deposition of the amorphous silicon is a complex process in which the deposited regions are not easy to control, especially for small dimensional devices such as submicron devices.

SUMMARY OF THE INVENTION

Accordingly, the present invention provides a local interconnection structure without amorphous silicon to eliminate the problems encountered with the prior art fabrication processes and products made thereby.

The present invention also provides a less complex method for fabricating the local interconnection structure.

The local interconnection structure of the present invention is formed on a silicon substrate in which a polysilicon gate and number of diffusion regions exist. The structure includes a number of metal silicide layers over the diffusion regions and the gate, a metal nitride layer over the silicide layers, and a dielectric layer over the nitride layer. The metal nitride layer forms an interconnection between the diffusion layers and the gate. The method for fabricating the interconnection structure includes the steps of preparing the silicon substrate, sputtering a metal layer, annealing to form the silicide layers and the nitride layer, depositing the dielectric layer, and patterning the nitride layer.

By eliminating the amorphous silicon, the local interconnection structure of the present invention can be fabricated simply and precisely. Moreover, the structure can connect to an external interconnection for biasing.

DESCRIPTION OF THE PREFERRED EMBODIMENT

Figure 1:
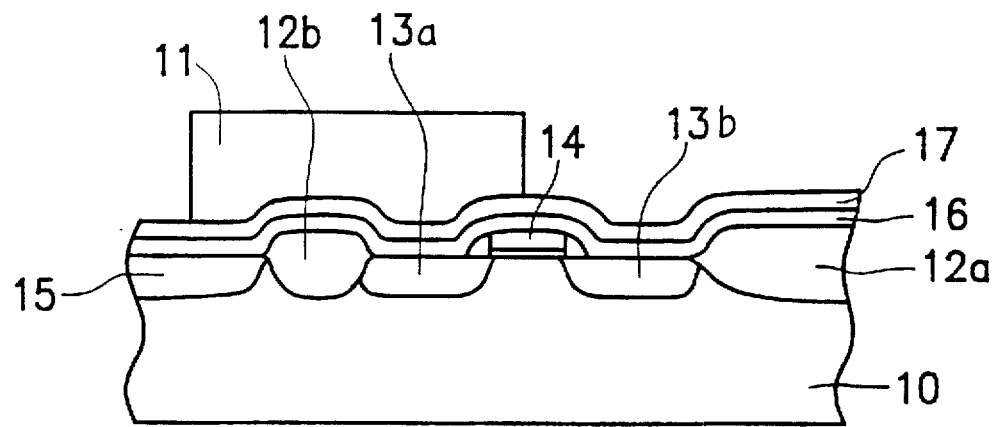
FIG. 1 through FIG. 3 are cross-sectional views illustrating prior art processes for fabricating a conventional local interconnection structure.
Figure 2:
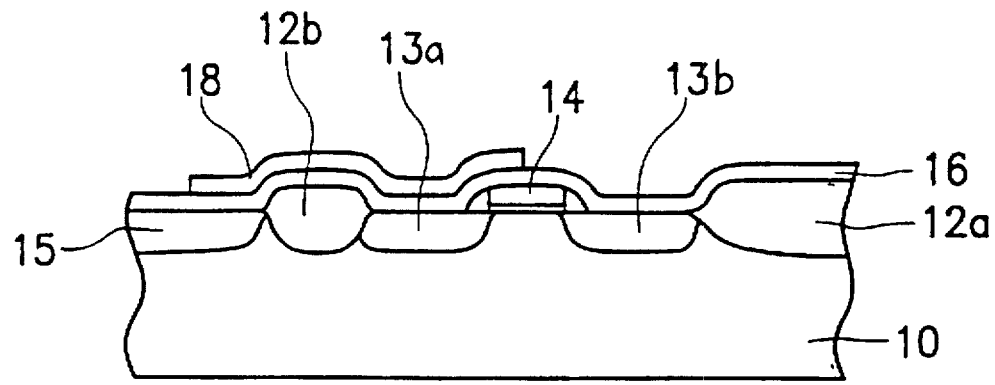
Figure 3:
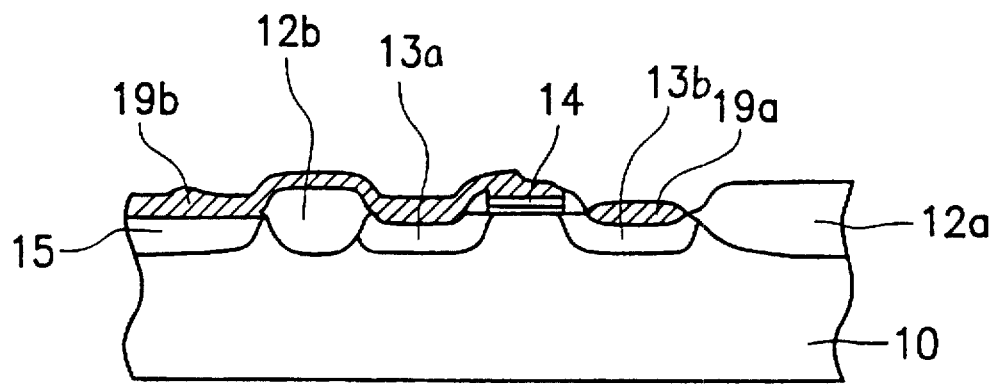
Figure 4:
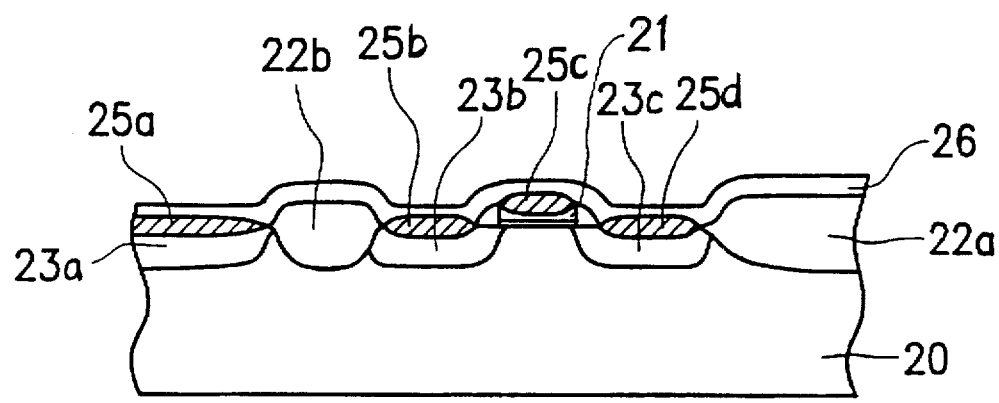
FIG. 4 through FIG. 6 are cross-sectional views illustrating the processes of the local interconnection structure according to a preferred embodiment of the present invention.
Figure 5:
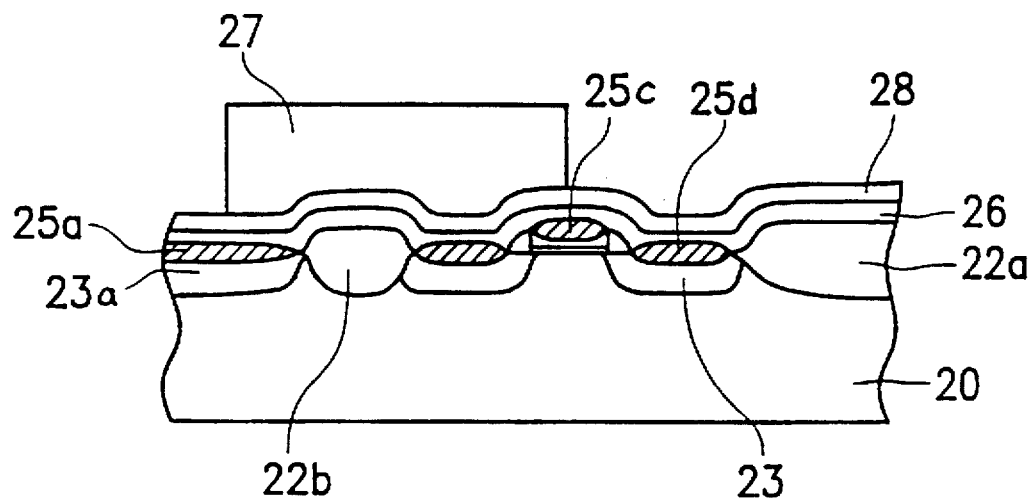
Figure 6:
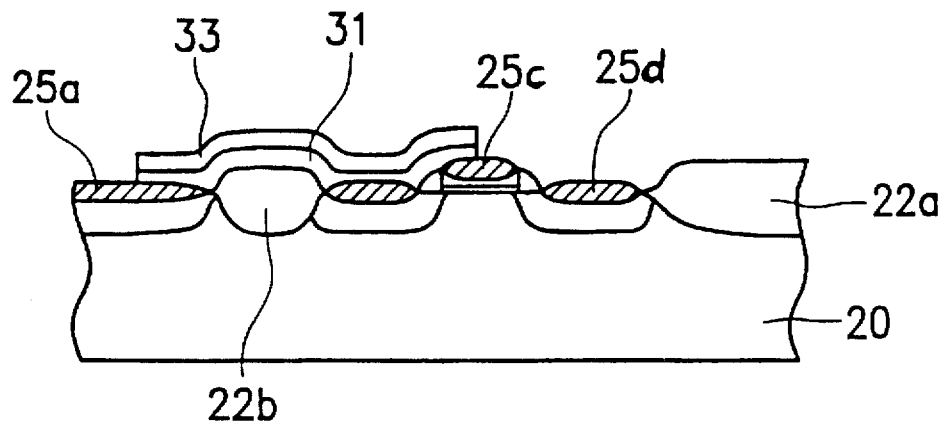

FIG. 4 through FIG. 6 are cross-sectional views which illustrate a process for fabricating a local interconnection structure according to a first preferred embodiment of the present invention. To form silicide contacts and a local interconnection, a metal layer is sputtered over a silicon substrate 20 which has field oxide layers 22a and 22b, polysilicon gate 21 (with spacers), and diffusion regions 23a, 23b and 23c. Since methods for forming the gate, the field oxide layers and the diffusion regions are well known to those skilled in the art of semiconductor processing, they are not further described herein. The metal layer can be a titanium layer. An annealing step is then carried out to form metal silicide over the diffusion regions and the polysilicon gate as a result of the reaction of the metal layer and the silicon materials. Moreover, since the annealing step is carried out in nitrogen-containing ambient or atmosphere, the metal layer will react with the nitrogen to become metal nitride. Referring to FIG. 4, after the annealing step, silicide layers 25a, 25b, 25c and 25d are formed over diffusion regions 23a, 25b, polysilicon gate 21 and diffusion region 23c, respectively. Over the silicide layers and field oxide layers 22a and 22b is a metal nitride layer 26. In the preferred embodiment, the metal layer is a titanium layer. The annealing step can be carried out in nitrogen-containing ambient (for example, N2 or NH3 gases), at a temperature of about 600°–750° C. Therefore, silicide layers 25a–25d are titanium silicide (TiSi) and nitride layer 26 is a titanium nitride (TiN) layer. It is noted that a multi-step annealing process, such as the two-step annealing utilized in the conventional method, can also be utilized in the present invention to improve the quality of the silicide layers.

Referring to FIG. 5, a dielectric layer 28 is formed over nitride layer 26 with a deposition method such as chemical vapor deposition (CVD). Dielectric layer 28 can be a silicon dioxide (SiO2) layer or a silicon nitride (SiN) layer. A mask layer 27 is formed over dielectric layer 28 to cover regions for local interconnection. Mask layer 27 can be a photoresist layer.

The structure of FIG. 5 is then etched. Dielectric layer 28 and nitride layer 26 in the regions covered by mask layer 27 remain, while those in other regions are removed by etching. The etching step can use a reactive ion etching (RIE) method. Referring to FIG. 6, the local interconnection structure is finished after the removal of mask layer 27. In the figure, nitride layer 31, which is covered by dielectric layer 33, electrically connects silicide layers 25a–25c over field oxide layer 22b.

If dielectric layer 33 is a silicon nitride (SiN) layer, it can serve as a stop layer in later etching steps to prevent damage to metal nitride layer 31, since the etching mechanism for nitride is different from that of oxide. Accordingly, metal nitride layer 31 can be a pad in a contact window for external interconnection lines to contact the device region to which the MOS transistor of FIG. 6 belongs. If an oxide passivation layer is deposited over the structure of FIG. 6, nitride dielectric layer 31 can be a stop layer when the oxide layer is etched to form contact windows. Another etching step is then performed on nitride layer 33 to expose metal nitride layer 31 in the contact window. Therefore, the external interconnection line formed over the oxide passivation layer can easily and directly enter the contact window to connect with metal nitride layer 31. Thus, the method of the present invention simplifies the manufacturing processes for a semiconductor integrated circuit and allows it to be readily controlled.

The local interconnection structure electrically connects the gate and specific diffusion regions in the substrate. Since the current flowing in the gate is quite small, the gate and the connected diffusion regions can still attain an equilibrium state of the electrical potential through the nitride interconnection line which has a high effective resistance. However, if the nitride layer is also provided for connecting an external interconnection line and for biasing the device, the resistance should be reduced. Therefore, another embodiment of the present invention lowers the resistance of the local interconnection line. This embodiment is described by reference to the cross-sectional views of FIG. 7 through FIG. 12.

Figure 7:
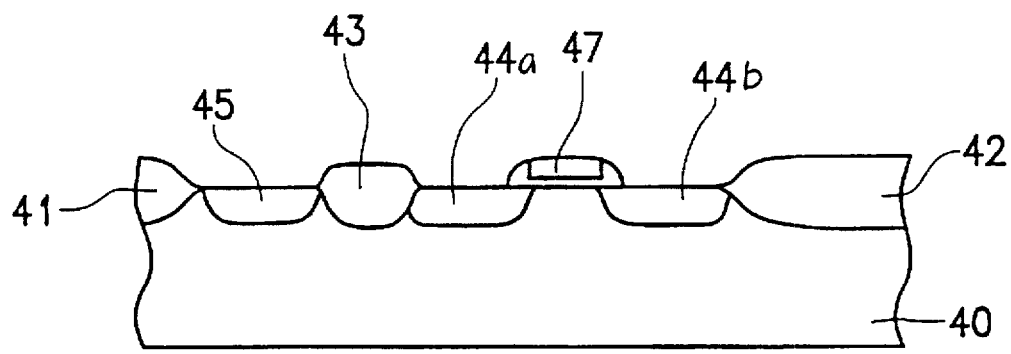
FIG. 7 through FIG. 12 are cross-sectional views illustrating the processes of the local interconnection structure according to another preferred embodiment of the present invention.
Figure 8:
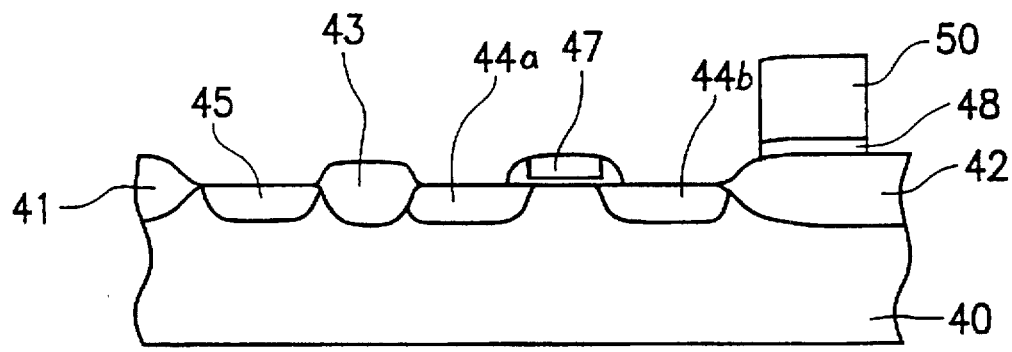

Referring first to FIG. 7, as in the prior art and the first embodiment, a silicon substrate 40 having field oxide layers 41, 42 and 43, diffusion regions 44a, 44b and 45, and a polysilicon gate structure 47 is provided. Gate structure 47 and diffusion regions 44a and 44b form a MOS transistor which is isolated from diffusion region 45 by field oxide 43.

To form a local interconnection between gate 47, diffusion region 44b and an external line which applies a bias to the MOS transistor, a contact window is formed over field oxide 42 by first depositing a polysilicon layer over the structure shown in FIG. 7 to define a contact window region. A mask layer 50 defining the contact window region is then formed over the polysilicon layer on top of field oxide 42. The portion of the polysilicon not protected by mask layer 50 is then etched away so that only polysilicon layer 48, shown in FIG. 8 and covered by mask 50, remains over field oxide layer 42.

Figure 9:
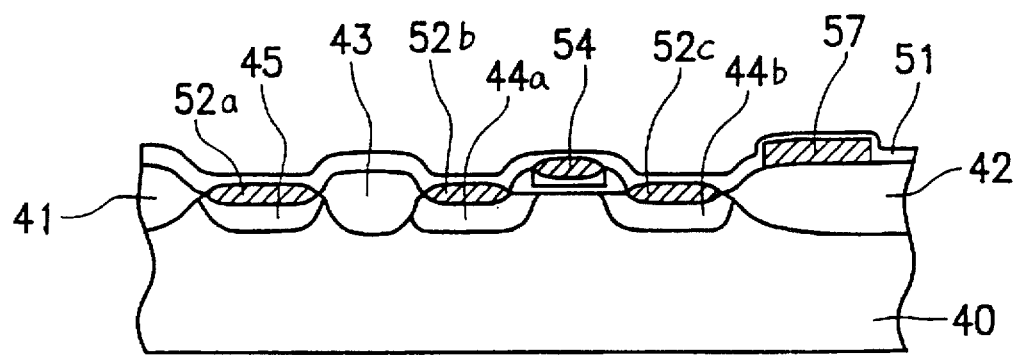

After the removal of mask 50, a metal layer is sputtered over polysilicon layer 48, the diffusion regions, polysilicon gate 47 and the field oxide layers. An annealing step is carried out to form silicide and nitride layers. Referring to FIG. 9, a number of silicide layers 52a–52c, 54, and 57 are formed in the regions where the metal layer contacts the silicon material. Over the silicide layers and field oxide layers is a metal nitride layer 51.

Figure 10:
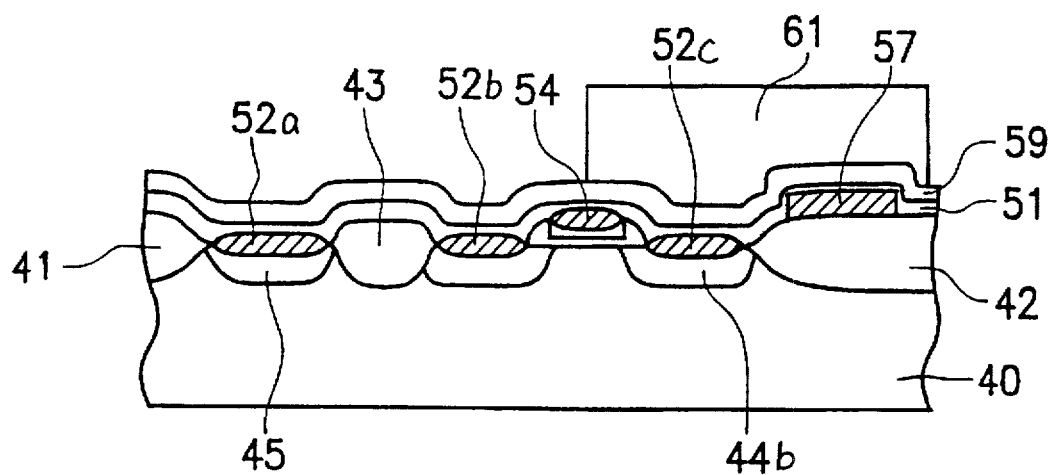

Similar to the first embodiment, a dielectric layer 59 is deposited over the metal layer and the silicide layers. Referring to FIG. 10, another mask 61 is formed over dielectric layer 59 to define the local interconnection region. That is, mask layer 61 covers a region including a portion of the gate, diffusion region 44b and silicide layer 57 which is provided for the contact window.

Figure 11:
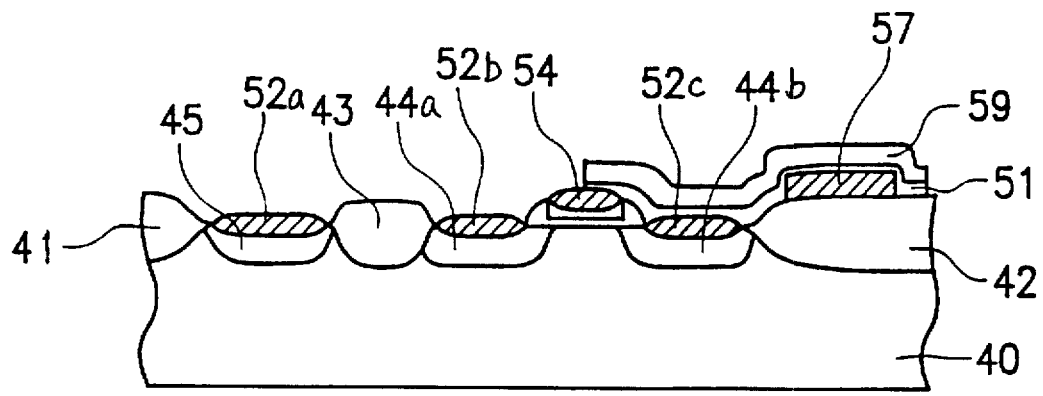

The structure of FIG. 10 is etched to remove dielectric material and nitride material which are not covered by mask 61. As shown in FIG. 11, a local interconnection structure between gate silicide 54, diffusion region 44b (silicide layer 52c) and silicide layer 57 is formed.

Figure 12:
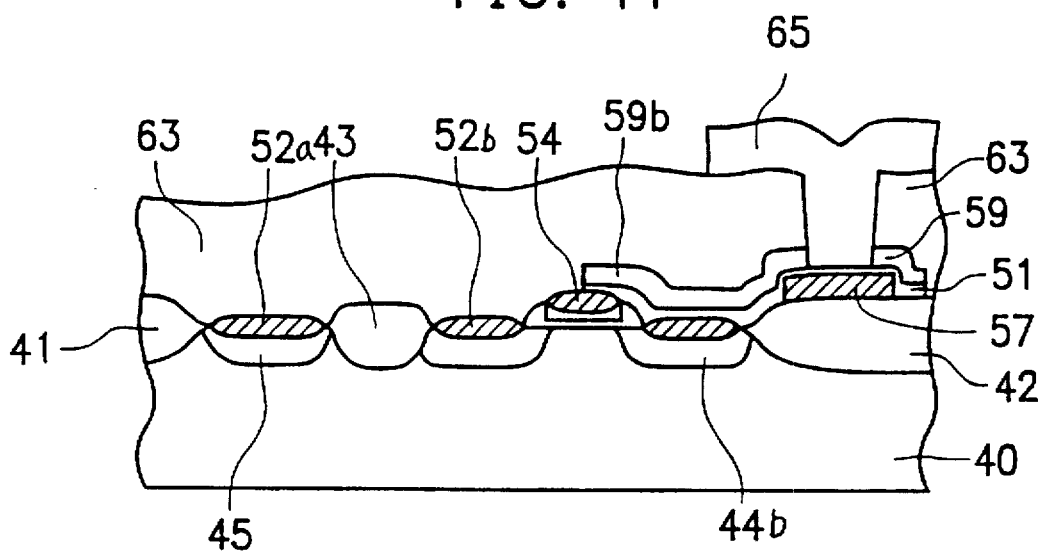

Referring to FIG. 12, a passivation layer 63 is applied to protect the devices and a contact window 65 is formed over the contact window region through passivation layer 63 and dielectric layer 59 which extends to the local interconnection structure. A metal interconnection line which contacts nitride layer 51 is then formed in the contact window. Since nitride layer 51 is connected in parallel with silicide layer 57, the resistance of the interconnection line is reduced, thereby improving its performance.

What is claimed is:

1. A method for fabricating a local interconnection structure on a silicon substrate which has a plurality of diffusion regions and a polysilicon gate, said method comprising:

forming a metal layer over said silicon substrate;

heating said metal layer and said silicon substrate in a nitrogen-containing atmosphere to form silicide layers over said polysilicon gates and said diffusion regions and to form a metal nitride layer over said silicon substrate;

forming a dielectric layer over said metal nitride layer; and patterning said dielectric layer and said metal nitride layer to form said local interconnection structure by covering with a mask said local interconnection structure to be formed and etching away portions of both said dielectric layer and said metal nitride layer not covered by said mask and removing said mask after said etching.

2. The method as claimed in claim 1, wherein said metal layer is formed by sputtering a titanium layer.

3. The method as claimed in claim 1, wherein said metal layer is heated by a rapid thermal process.

4. The method as claimed in claim 1, wherein said dielectric layer is formed by depositing a silicon dioxide layer.

5. The method as claimed in claim 1, wherein said dielectric layer is formed by depositing a silicon nitride layer.

6. The method as claimed in claim 1 further comprising:

forming a polysilicon layer over said substrate to define a contact window region before the formation of said metal layer.

7. The method as claimed in claim 6 further comprising:

forming a passivation layer over said local interconnection structure;

forming a contact window over said contact window region through said passivation layer and said dielectric layer; and forming a metal line over said passivation layer which extends through said contact window to contact said metal nitride layer.

8. The method as claimed in claim 1 wherein said step of patterning is performed by reactive ion etching.

9. The method as claimed in claim 1 wherein said mask comprises photoresist.

* * * * *